United States Patent
Han

(10) Patent No.: US 10,083,636 B2
(45) Date of Patent: Sep. 25, 2018

(54) FLEXIBLE DISPLAY DEVICE WITH A CUSHION LAYER

(71) Applicant: Samsung Display Co., Ltd., Yongin-si (KR)

(72) Inventor: Jiwon Han, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/650,321

(22) Filed: Jul. 14, 2017

(65) Prior Publication Data

US 2018/0053451 A1   Feb. 22, 2018

(30) Foreign Application Priority Data

Aug. 18, 2016  (KR) .................. 10-2016-0105029

(51) Int. Cl.
| | | |
|---|---|---|
| *H01L 27/10* | (2006.01) | |
| *G09F 9/30* | (2006.01) | |
| *G06F 1/16* | (2006.01) | |
| *H01L 51/00* | (2006.01) | |
| *H01L 51/56* | (2006.01) | |
| *H01L 27/32* | (2006.01) | |

(52) U.S. Cl.
CPC ............ *G09F 9/301* (2013.01); *G06F 1/1652* (2013.01); *H01L 51/0097* (2013.01); *H01L 51/56* (2013.01); *H01L 27/3248* (2013.01); *H01L 27/3258* (2013.01)

(58) Field of Classification Search
CPC ... H04L 67/1097; H04L 63/105; H04L 67/42; H04N 5/378; G06F 21/6218
USPC ........................................... 257/211
See application file for complete search history.

(56) References Cited

U.S. PATENT DOCUMENTS

| | | | |
|---|---|---|---|
| 2014/0268595 A1 | 9/2014 | Eom | |
| 2015/0187845 A1* | 7/2015 | Kim | ............... H01L 27/323 |
| 2015/0200333 A1* | 7/2015 | Okumoto et al. | ...... H01L 33/20 |

FOREIGN PATENT DOCUMENTS

| | | |
|---|---|---|
| JP | 05-205656 A | 8/1993 |
| KR | 10-2014-0112232 B1 | 9/2014 |
| KR | 10-2015-0079263 A | 7/2015 |
| KR | 10-2016-0079263 A | 7/2015 |

* cited by examiner

*Primary Examiner* — Andy Huynh
(74) *Attorney, Agent, or Firm* — H.C. Park & Associates, PLC

(57) ABSTRACT

Provided is a flexible display device including a flexible display panel having a substrate and an organic electroluminescent member disposed on the substrate, a window member disposed on the flexible display panel, and a protection member disposed under the flexible display panel, wherein the protection member includes a metal layer disposed under the substrate, a cushion layer disposed under the metal layer, and a planarization layer and disposed between the metal layer and the cushion layer.

20 Claims, 16 Drawing Sheets

FLEXIBLE DISPLAY DEVICE WITH A CUSHION LAYER

CROSS-REFERENCE TO RELATED APPLICATION

This application claims priority from and the benefit of Korean Patent Application No. 10-2016-0105029, filed on Aug. 18, 1016, which is hereby incorporated by reference for all purposes as if fully set forth herein.

BACKGROUND

Field

Exemplary embodiments relate to a flexible display device. More particularly, exemplary embodiments relate to a flexible display device with improved surface quality.

Discussion of the Background

A display device provides a user with information by displaying various images on a display screen. Recently, a display device which is capable of being bent is being developed. Unlike a flat panel display, a flexible display device may be folded, rolled, or bent like a piece of paper. A flexible display device which may be transformed into a variety of shapes, is easy to carry, and may improve user convenience. A flexible display device may be classified into a rollable display device, a foldable display device, etc.

SUMMARY

Exemplary embodiments provide a flexible display device overcoming the limitation of deterioration in surface quality.

Additional aspects will be set forth in the detailed description which follows, and, in part, will be apparent from the disclosure, or may be learned by practice of the inventive concept.

An exemplary embodiment of the present disclosure provides a flexible display device including a flexible display panel having a substrate and an organic electroluminescent member disposed on the substrate, a window member disposed on the flexible display panel, and a protection member disposed under the flexible display panel, wherein the protection member includes a metal layer disposed under the substrate, a cushion layer disposed under the metal layer, and a planarization layer disposed between the metal layer and the cushion layer.

In another exemplary embodiment of the present disclosure, a flexible display device includes a flexible display panel having a substrate and an organic electroluminescent member disposed on the substrate, a window member disposed on the flexible display panel, and a protection member disposed under the flexible display panel, wherein the protection member includes a metal layer disposed under the substrate and having a nickel-iron alloy, an organic layer disposed under the metal layer, and a cushion layer disposed under the organic layer and at least one of the upper and the lower surface of which includes an uneven portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
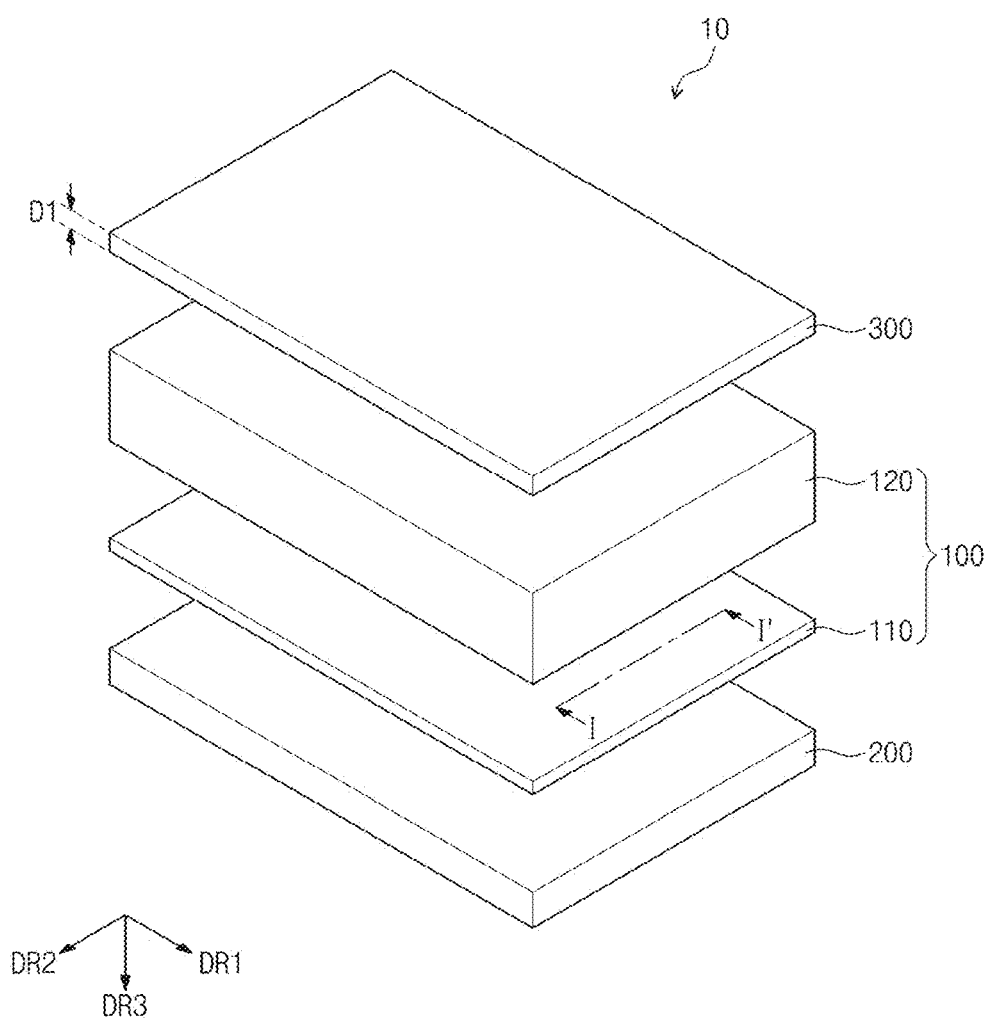
FIG. 1 is an exploded perspective view of a flexible display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is an exploded perspective view of a flexible display device according to an exemplary embodiment of the present disclosure.

Referring to FIG. 1, a flexible display device 10 according to an exemplary embodiment of the present disclosure includes a flexible display panel 100, a protection member 200 disposed under the flexible display panel 100, and a window member 300 disposed on the flexible display panel 100.

A thickness direction of the flexible display device 10 according to an exemplary embodiment of the present disclosure is indicated by a third direction axis DR3. A front portion (or a front surface) and a lower portion (or a rear surface) of each member is distinguished by the third direction axis DR3.

In this specification, "flexible" represents a property of being bent, and includes all from a structure of being completely folded to a structure of being bent at several nanometer levels.

A flexible display panel 100 may include a substrate 110 and an organic electroluminescent member 120 disposed on the substrate 110.

A substrate 110 may be a flexible substrate. The substrate 110 may be a kind which includes an organic polymer. An organic polymer included in the substrate 110 may be polyethylene terephthalate (PET), polyethylene naphthalate (PEN), polyimide, polyether sulfone, etc. However, the exemplary embodiment of the present disclosure is not limited thereto. The substrate 110 may be selected in consideration of mechanical strength, thermal stability, transparency, surface smoothness, ease of handling, waterproof property, flexibility, etc. The substrate 110 may also have a single-layer structure, or a multi-layer structure.

Although not shown, a corner of the substrate 110 may be round to reduce a risk of damage.

A detailed explanation for the organic electroluminescent member will be described later.

A protection member 200 may be disposed under the substrate 110, and absorbs external impact to prevent an organic electroluminescent member 120 and the like which are disposed on the substrate 110 from being damaged from the external impact. In addition, the protection member 200 may adhere the flexible display panel 100 to other components, such as a case, without being damaged.

Hereinafter, referring to FIG. 2 to FIG. 8, the protection member 200 will be described in detail.

Figure 2:
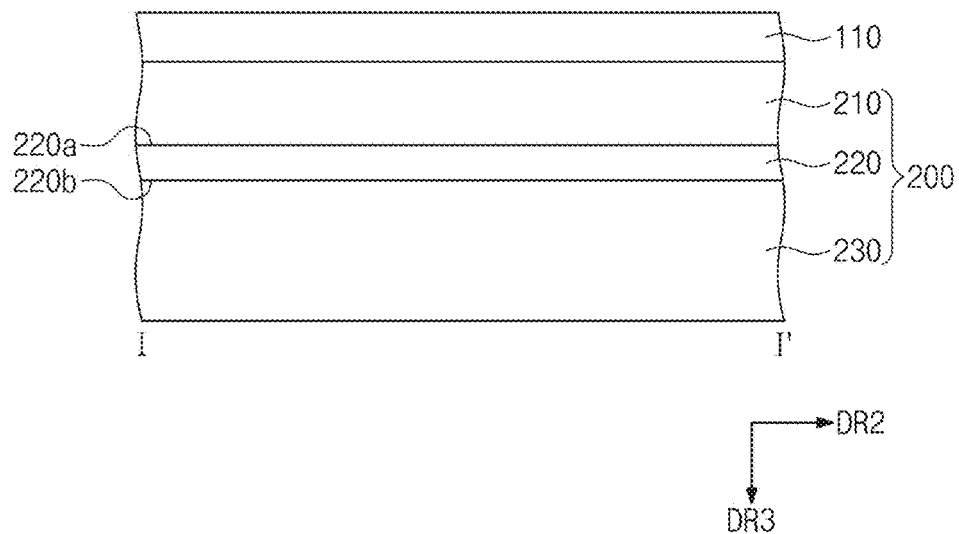
FIG. 2 is a schematic cross-sectional view taken along line I-I' of FIG. 1.

FIG. 2 is a schematic cross-sectional view taken along line I-I' of FIG. 1. FIG. 2 is a cross-sectional view of the substrate 110 and the protection member 200.

Referring to FIG. 2, the protection member 200 includes a cushion layer 230, a planarization layer 220, and a metal layer 210. The metal layer 210 may be disposed under the substrate 110. The cushion layer 230 may be disposed under the metal layer 210, and the planarization layer 220 may be disposed between the metal layer 210 and the cushion later 230.

Figure 3:
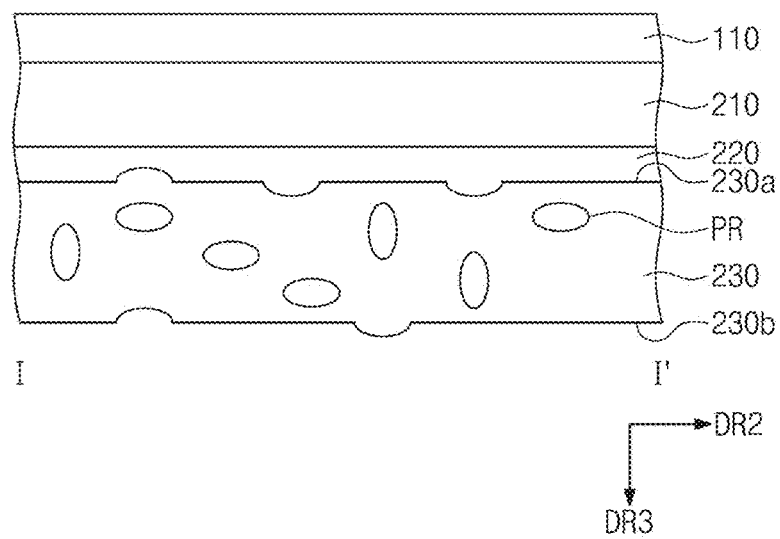
FIG. 3 is a cross-sectional view showing the cushion layer of FIG. 2 in more detail.

FIG. 3 is a cross-sectional view showing the cushion layer of FIG. 2 in more detail.

Referring to FIG. 2 and FIG. 3, at least one of an upper surface 230a or a lower surface 230b of the cushion layer 230 may include an uneven portion. At least one of an upper surface 230a or a lower surface 230b of the cushion layer 230 may include a convex portion or a concave portion. A convex portion may mean protruding upward with respect to a flat surface, and a concave portion may mean regressing downward with respect to a flat surface. For example, the cushion layer 230 may include an uneven portion on the upper surface 230a, or may respectively include an uneven portion on the upper surface 230a and the lower surface 230b.

The cushion layer 230 may include a plurality of air gaps PR defined thereinside. The cushion layer 230 may be porous. Due to the plurality of air gaps PR defined inside the cushion layer 230, at least one of the upper surface 230a or the lower surface 230b of the cushion layer 230 may include an uneven portion. For example, if a part of the air gaps PR are disposed to be adjacent to the upper surface 230a, the upper surface 230a may include a convex portion protruding toward the upper direction, and as a result, the upper surface 230 may include an uneven portion.

The cushion layer 230, for example, may be a polymer resin foam. In this case, at least one of the upper surface 230a or the lower surface 230b of the cushion layer 230 may include an uneven portion, and a plurality of air gaps PR may be defined inside the cushion layer.

Because of the plurality of air gaps PR defined inside the cushion layer 230, the cushion layer 230 absorbs external impact to play a role of preventing the organic electroluminescent member 120 and the like which are disposed on the substrate 110 from being damaged from the external impact.

A planarization layer 220 may be disposed on the cushion layer 230 to prevent other components disposed on the cushion layer 230 from including an uneven portion due to an uneven portion included in at least one of the upper surface 230a or the lower surface 230b of the cushion layer 230. That is, the planarization layer 220 may provide a flat surface to prevent the uneven portion of the cushion layer 230 from causing surface irregularities of the other components disposed on the cushion layer 230.

The planarization layer 220 may be a kind in which the upper surface 220a is flat and the lower surface 220b includes an uneven portion. The planarization layer 220 may have the upper surface 220a which faces the metal layer 210 and may be substantially flat. The lower surface 220b of the planarization layer 220, which faces the cushion layer 230, may include an uneven portion. This uneven portion may be caused by an uneven portion of the cushion layer 230.

Figure 4:
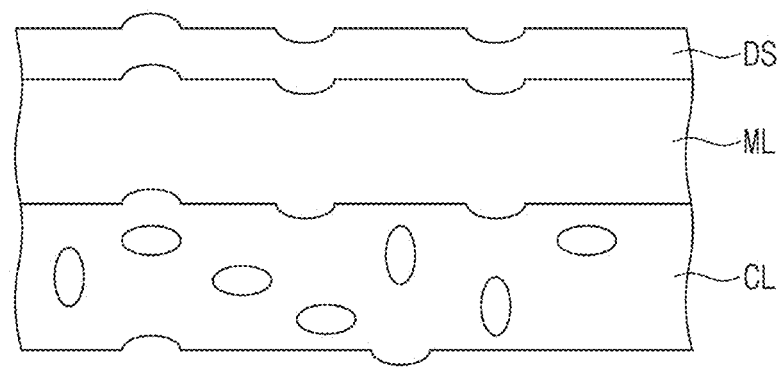
FIG. 4 is a schematic cross-sectional view of an existing typical flexible display device.

FIG. 4 is a schematic cross-sectional view of an existing typical flexible display device.

As shown in FIG. 4, because of an uneven portion defined on an upper surface and a lower surface of a cushion layer CL in existing arts, a metal layer ML and a substrate DS may include a surface having an uneven portion.

Figure 5A:
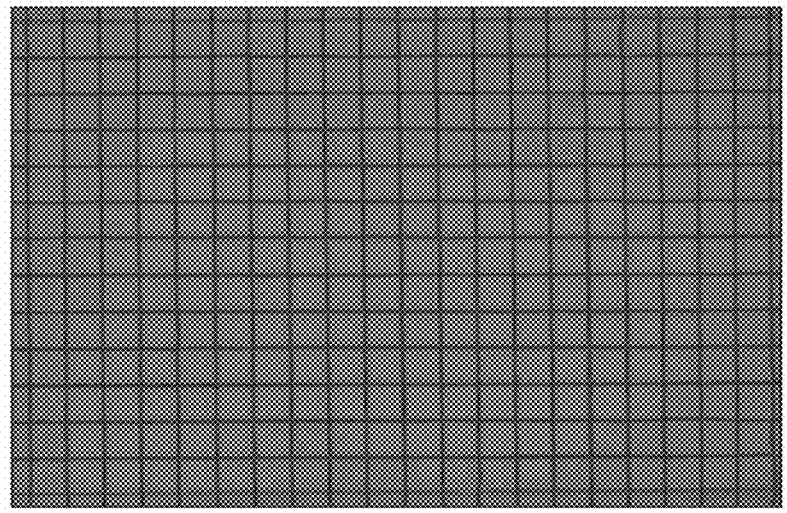
FIG. 5A is an image filmed for showing whether or not surface reflection of a flexible display device including a cushion layer is distorted.
Figure 5B:
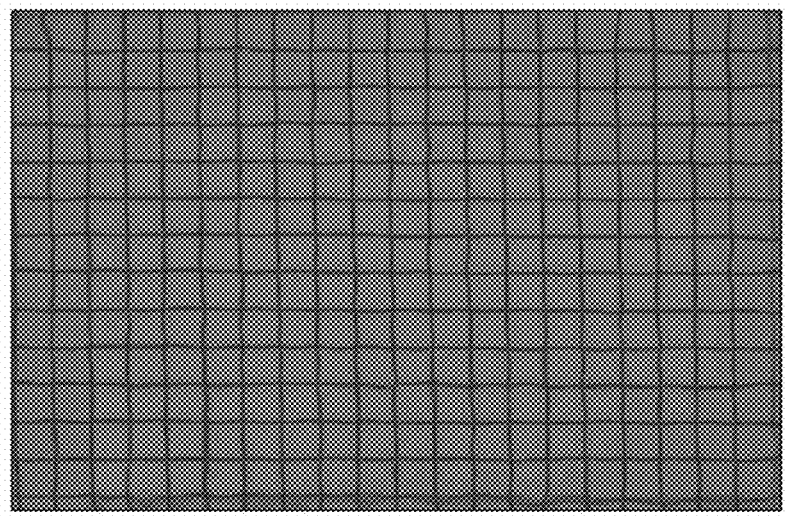
FIG. 5B is an image filmed for showing whether or not surface reflection of a flexible display device not including a cushion layer is distorted.

FIG. 5A is an image filmed for showing whether or not a surface reflection of a flexible display device including a cushion layer is distorted. FIG. 5B is an image filmed for showing whether or not a surface reflection of a flexible display device not including a cushion layer is distorted. FIG. 5A and FIG. 5B are not images of an exemplary embodiment of the present disclosure.

Referring to FIG. 5A and FIG. 5B, if a cushion layer is included, an uneven portion included in the cushion layer influences components disposed on the cushion layer, and ultimately deteriorates surface quality. In more detail, FIG. 5A shows a flexible display device which does not include a cushion layer where surface reflection distortion may be marginal. However, FIG. 5B shows a flexible display device which includes a cushion layer where surface reflection distortion is intensified. That is, an existing typical flexible display device which includes a cushion layer under a substrate to protect a flexible display panel and the like from an external impact, has a limitation in that surface quality may deteriorates.

Therefore, in the flexible display device 10 according to an exemplary embodiment of the present disclosure, the planarization layer 220 may be disposed on cushion layer 230 such that the uneven portion of the cushion layer 230 does not influence components disposed on the cushion layer 230. That is, because of the planarization layer 220, the uneven portion of the cushion layer 230 may not influence the window member 300 of FIG. 1 which may be disposed on the outermost region of the flexible display device 10, and consequently, a deterioration in surface quality caused by an uneven portion of the cushion layer 230 may be reduced.

Figure 6:
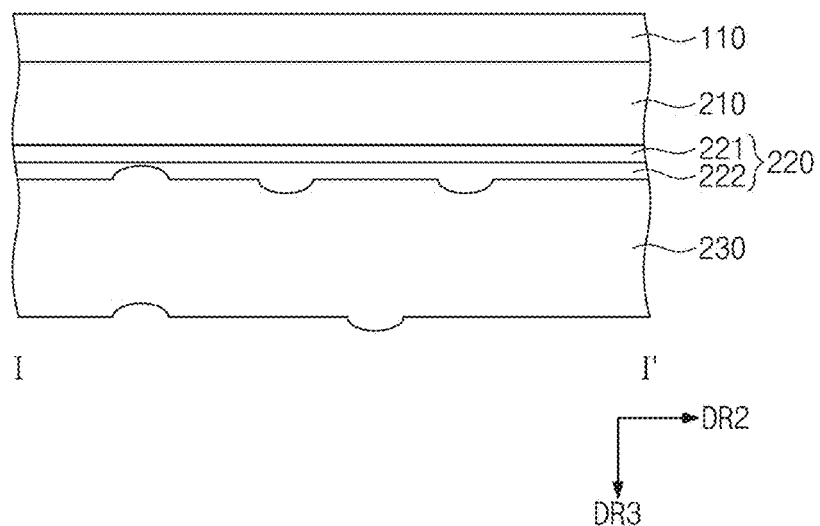
FIG. 6 is a schematic cross-sectional view taken along line I-I' of FIG. 1.
Figure 7:
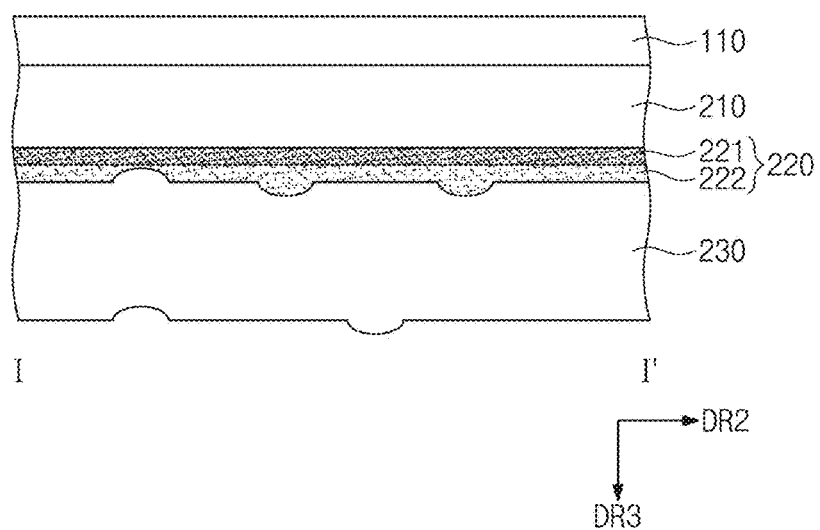
FIG. 7 is a schematic cross-sectional view taken along line I-I' of FIG. 1.

FIG. 6 is a schematic cross-sectional view taken along line I-I' of FIG. 1. FIG. 7 is a schematic cross-sectional view taken along line I-I' of FIG. 1.

Referring to FIG. 6 and FIG. 7, a planarization layer 220 may include a first sub-layer 221 and a second sub-layer 222. The first sub-layer 221 and the second sub-layer 222 may be in contact with each other. Between the first sub-layer 221 and the second sub-layer 222, other layers, such as a buffering layer and the like, may not be included.

The planarization layer 220 may include an organic material. For example, the planarization layer 220 may include at least one of poly urethane, poly acrylic, polyimide, or poly epoxy. For example, the planarization layer 220 may be a poly urethane layer. The planarization layer 220 may be a monolayer including poly urethane. However, the exemplary embodiment of the present disclosure is not limited thereto.

The first sub-layer 221 and the second sub-layer 222 may include the same material. Compared to a case in which the first sub-layer 221 and the second sub-layer 222 include a different material from each other, there may be an advantage in that process economics may be excellent. For example, each of the first sub-layer 221 and the second sub-layer 221 may be a poly urethane layer.

The first sub-layer 221 may be disposed under the metal layer 210 and the second sub-layer 222 may be disposed under the first sub-layer 221. Among the first sub-layer 221 and the second sub-layer 222, the first sub-layer 221 may be disposed directly adjacent to the metal layer 210, and the second sub-layer 222 may be disposed directly adjacent to the cushion layer 230.

The second sub-layer 222 may have a property of being softer than the first sub-layer 221 so as to accommodate uneven portions, and the first sub-layer 221 may have a property of being harder than the second sub-layer 222 so as provide a flat surface. For example, the density of the second sub-layer 222 may be lower than the density of the first sub-layer 221. That is, the planarization layer 220 may have a concentration gradient. In another example, the modulus of the second sub-layer 222 may be smaller than the modulus of the first sub-layer 221.

The planarization layer 220 may be in contact with the metal layer 220. Between the planarization layer 220 and the metal layer 210, another layer, such as a buffering layer or the like, may not be disposed.

The planarization layer 220, for example, may be coated on a lower surface of the metal layer 210 by a spin coating method or the like. However, the exemplary embodiment of the present disclosure is not limited thereto. The planarization layer 220 may be provided on the lower surface of the metal layer 210 by a chemical bonding in which a solution including an organic material is provided on a lower portion surface of the metal layer 210 after which the solution is evaporated.

When the planarization layer 220 includes the first sub-layer 221 and the second sub-layer 222, the planarization layer 220 may be provided by a multi-coating method. For example, when the first sub-layer which is an organic monomer layer is provided on a lower portion surface of the metal layer 210 by a first coating, and the second sub-layer which is an organic monomer layer is provided by a second coating, the organic monomer of the second sub-layer 222 may be provided having a lower density than the density of first sub-layer 221 because of an interaction of Van der Waals force of the organic monomer of the first sub-layer 221. The density may refer to the number of the organic monomers per unit volume.

The planarization layer 220 may have a thickness from several μm to several hundred μm. For example, the planarization layer 220 may be equal to or more than 10 μm and equal to or less than 500 μm in thickness. The planarization 220 may be thicker or thinner than the cushion layer 230. The cushion layer 230 may have a thickness from about 100 μm to 200 μm. For example, the cushion layer 230 may be about 150 μm in thickness.

Figure 8:
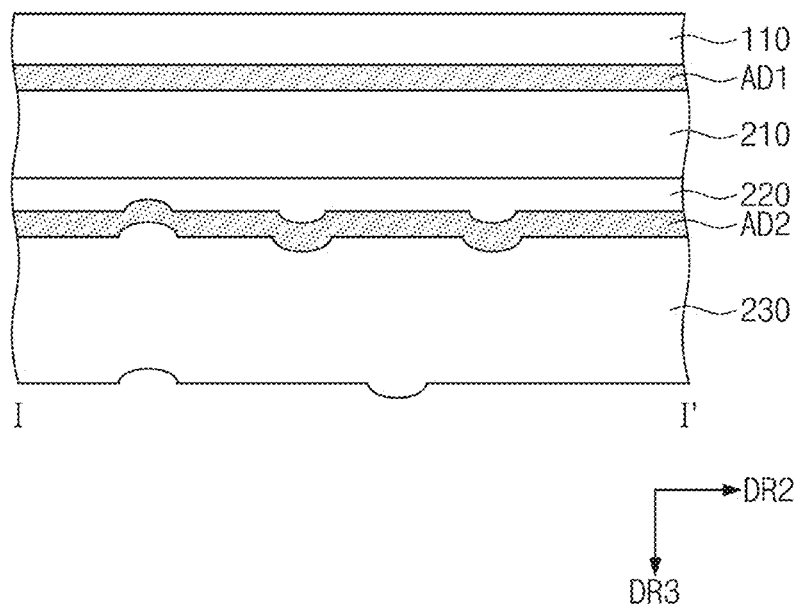
FIG. 8 is a schematic cross-sectional view taken along line I-I' of FIG. 1.

It may be desirable that the metal layer 210 includes a material having a high modulus value. The modulus of the metal layer 210 may have a GPa unit. In this case, when the flexible display device 10 is bent, a buckling rate among components disposed under the substrate 110 may be reduced, and as a result, delamination caused by buckling is reduced. Metal included in the metal layer 210 may also have a high modulus value. For example, the metal layer 210 may include a nickel-iron alloy. However, the exemplary embodiment of the present disclosure is not limited thereto. The metal layer 210 may be about 50 μm to about 100 μm inclusive in thickness FIG. 8 is a schematic cross-sectional view taken along line I-I' of FIG. 1.

The protection member 200 may further include a general component known in the art when needed. For example, referring to FIG. 8, the protection layer 200 may include a first adhesive member AD1 disposed between the metal layer 210 and the substrate 110. That is, the metal layer 210 may be adhered to a lower portion of the substrate 110 the first adhesive member AD1.

The protection layer 200 may further include a second adhesive member AD2 disposed between the planarization layer 220 and the cushion layer 230. Due to the uneven portion of the cushion layer 230, at least one surface of the second adhesive member AD2 may include an uneven portion.

The first adhesive member AD1 and the second adhesive member AD2 may be adopted from materials generally known in the art. The first adhesive member AD1 and the second adhesive member AD2 may be a pressure sensitive adhesive (PSA). The thickness of the first adhesive member AD1 may be greater than the thickness of the second adhesive member AD2.

The modulus of the planarization layer 220 may be greater than the modulus of each of the first adhesive member AD1 and the modulus of the second adhesive member AD2. In this case, when bending occurs by an external force, a delamination rate may be lowered.

The window member 300 may be a flexible window member. Referring to FIG. 1, the window member 200 may include a glass substrate and have a thickness equal to or more than 50 μm and equal to or less than 90 μm. When the flexible display device 100 includes a glass substrate having a thickness from 50 μm to 90 μm, the flexible display device 10 may be bent easily according to an external force without having cracks, and may simultaneously have enough durability to protect the flexible display panel 100 and the like. However, the exemplary embodiment of the present disclosure is not limited thereto. The window member 300 may employ other means generally known in the art. For example, the window member 300 may have a structure in which a polymer layer having flexibility is disposed on one surface of a glass substrate, or be composed of a polymer layer only.

Generally, in the case of a flat rigid display device, a glass substrate having about 150 μm or more in thickness may be used as a window member. In this case, since the window member is relatively thick, an uneven portion of a cushion layer which is disposed under a display device has almost no effect on the window member. That is, there may be almost no deterioration in surface quality caused by an uneven portion of a cushion layer. The flexible display device 10 according to an exemplary embodiment of the present disclosure applies a planarization layer on a cushion layer to reduce deterioration in surface quality caused by an uneven portion of the cushion layer when a relatively thin window member is applied.

Figure 9:
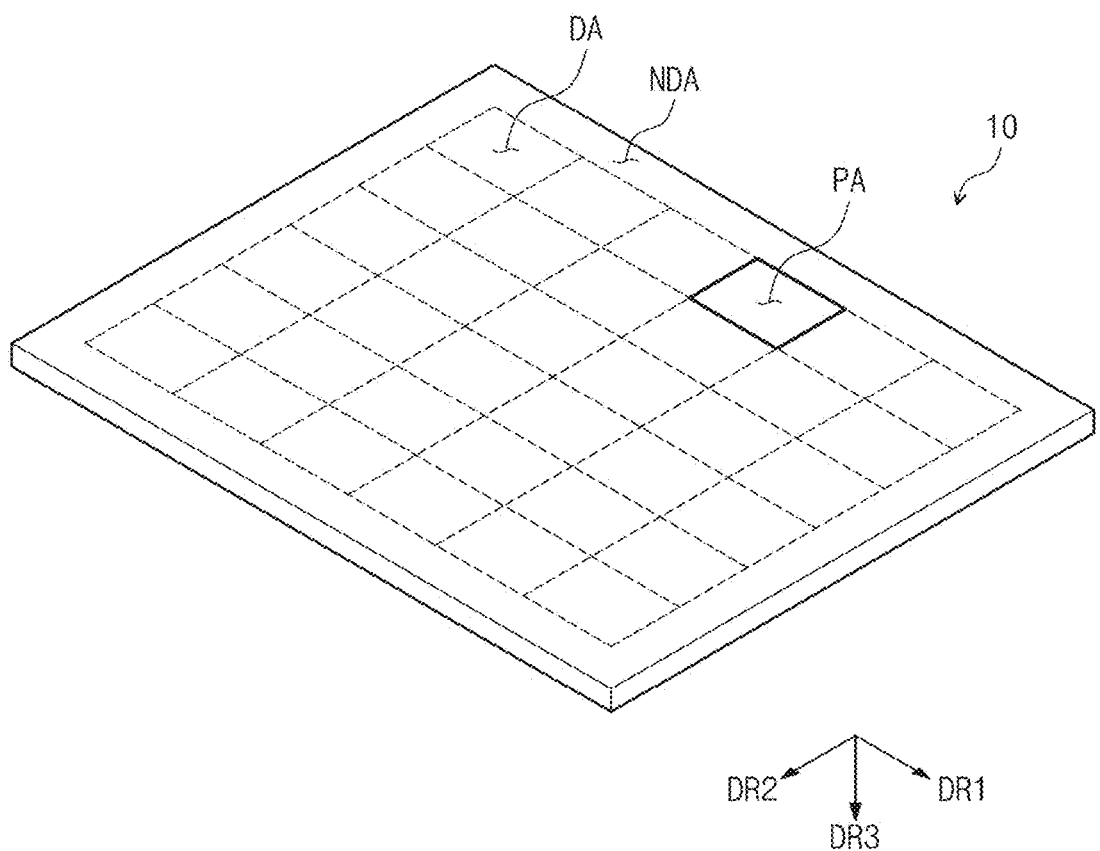
FIG. 9 is a perspective view of a flexible display device according to an exemplary embodiment of the present disclosure.
Figure 10:
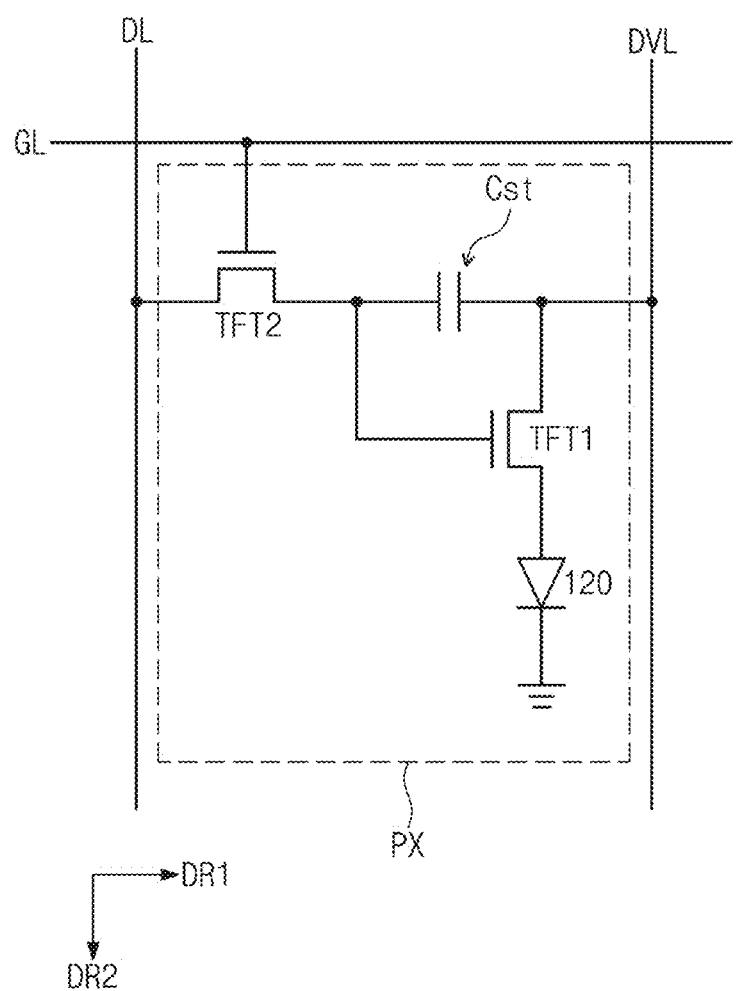
FIG. 10 is a circuit diagram of a pixel among pixels included in a flexible display device according to an exemplary embodiment of the present disclosure.

FIG. 9 is a perspective view of a flexible display device according to an exemplary embodiment of the present disclosure. FIG. 10 is a circuit diagram of a pixel among pixels included in a flexible display device according to an exemplary embodiment of the present disclosure.

Hereinafter, referring to FIG. 9 and FIG. 10, the flexible display device 10 according to an exemplary embodiment of the present disclosures will be described in more detail.

Referring to FIG. 9, the flexible display device 10 according to an exemplary embodiment of the present disclosure may be divided into a display area DA and a non-display area NDA. The display area DA may display an image. When viewed from a thickness direction (for example DR3) of the flexible display device 10, the display area DA may have an approximate rectangular shape, but it is not limited thereto.

The display area DA may include a plurality of pixel areas PA. The pixel areas PA may be disposed in a matrix form. A plurality of pixels may be disposed on the pixel areas PA. Each of the pixels may include an organic electroluminescent member 120.

The non-display area NDA may not display an image. When viewed from the thickness direction DR3 of the flexible display device 10, the non-display area NDA, may surround the display area DA. The non-display area NDA may be adjacent to the display area DA in a first direction DR1 and a second direction DR2. The second direction DR2 may cross each of the first direction DR1 and the third direction DR3.

Referring to FIG. 10, each of the pixels may be connected to a wiring part including a gate line GL, a data line DL, and a driving voltage line DVL. Each of the pixels may include thin film transistors TFT1 and TFT2 connected to the wiring part, the organic electroluminescent member connected to the thin film transistors TFT1 and TFT2, and a capacitor.

The gate line GL may be extended in the first direction DR1. The data line may be extended in the second direction DR2 crossing the gate line GL. The driving voltage line DVL may be extended in substantially the same direction as the data line DL, and may be the second direction DR2. The gate line GL may transfer a scan signal to the thin film transistors TFT1 and TFT2. The data line DL may transfer a data signal to the thin film transistors TFT1 and TFT2, and the driving voltage line DVL may provide a driving voltage to the thin film transistors TFT1 and TFT2.

The thin film transistors TFT1 and TFT2 may include a driving thin film transistor TFT1 to control the organic electroluminescent device, and a switching thin film transistor TFT2 to switch the driving thin film transistor TFT1. In an exemplary embodiment of the present disclosure, a case in which each of the pixels PX include two transistors TFT1 and TFT2 is described, but it is not limited thereto. Each of the pixels PX may include one thin film transistor and a capacitor, or each of the pixels PX may be provided with more than two thin film transistors and more than two capacitors.

Figure 11:
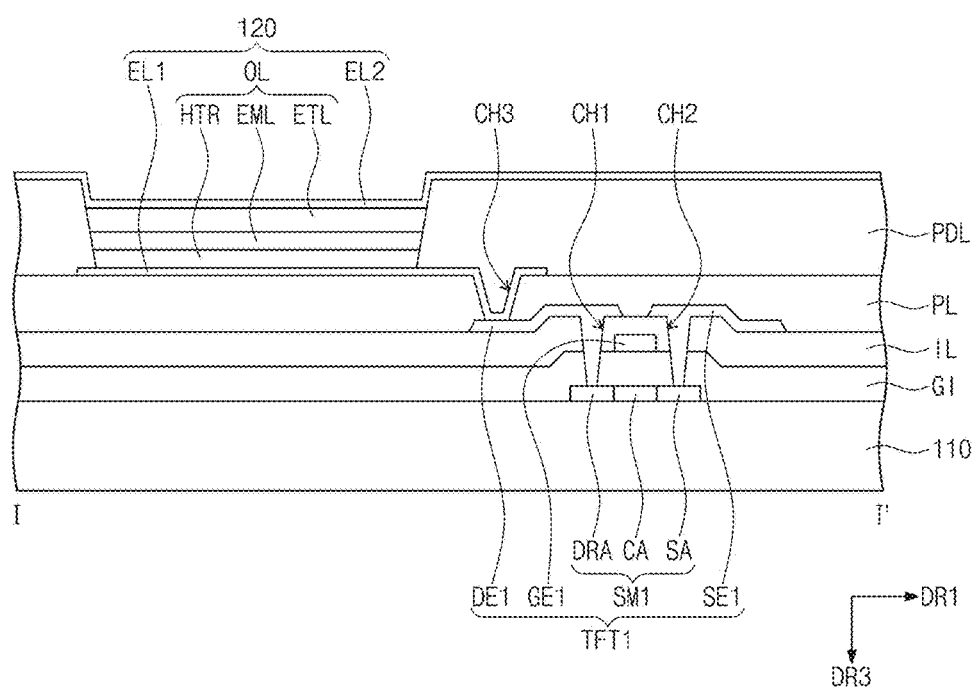
FIG. 11 is a cross-sectional view of a portion of the circuit diagram of FIG. 10.

FIG. 11 is a cross-sectional view of a portion of the circuit diagram of FIG. 10. Specifically, FIG. 11 is a schematic cross-sectional view of the driving thin film transistor TFT1 and the organic electroluminescent member of FIG. 10. Hereinafter, the flexible display panel 100 of FIG. 1 will be explained in detail.

The flexible display panel 100 of FIG. 1, as described previously, may include the substrate 110, the thin film transistors TFT1 and TFT 2 disposed on the substrate 110, and the organic electroluminescent member 120.

Referring to FIG. 10 and FIG. 11, the driving thin film transistor TFT1 includes a first gate electrode GE1, a first source electrode SE2, and a first drain electrode DE1. The first gate electrode GE1 may be connected to a first common electrode (now shown). The first source electrode SE1 may be connected to the driving voltage line DVL. The first drain electrode DE1 may be connected to a first electrode EL1 through a third contact hole CH3.

The capacitor Cst may be connected between the first gate electrode GE1 and the first source electrode SE1 of the driving thin film transistor TFT1 to charge and maintain a data signal inputted into the first gate electrode GE1 of the driving thin film transistor TFT1.

A first semiconductor layer SM1 may be disposed on the substrate 110. Although now shown in detail, the first semiconductor layer SM1 may be provided with a semiconductor material, and operate as an active layer of the driving thin film transistor TFT1. The first semiconductor layer SM1 may include a source area SA, a drain area DRA, and a channel area CA disposed between the source area SA and the drain area DRA. The first semiconductor layer SM1 may be made of an inorganic semiconductor or an organic semiconductor. The source area SA and the drain area DRA may be doped with n-type impurity or p-type impurity.

A gate insulation layer GI may be disposed on the first semiconductor layer SM1. The gate insulation layer GI may cover the first semiconductor layer SM1. The gate insulation layer GI may be made of an organic insulation material or an inorganic insulation material.

The first gate electrode GE1 may be disposed on the gate insulation layer GI. The first gate electrode GE1 may be disposed to cover an area corresponding to the channel area CA of the first semiconductor layer SM1.

An interlayer insulation layer IL may be disposed on a second gate electrode GE2. The interlayer insulation layer IL may cover the first gate electrode GE1. The interlayer insulation layer IL may be made of an organic insulation material or an inorganic insulation material.

The first source electrode SE1 and the first drain electrode DE1 are disposed on the interlayer insulation layer IL. The first drain electrode DE1 comes into contact with the drain area DRA of the first semiconductor layer SM1 through the first contact hole CH1 defined in the gate insulation layer GI and the interlayer insulation layer IL. The first source electrode SE1 comes into contact with the source area SA of the first semiconductor layer SM1 through a second contact hole CH2 defined in the gate insulation layer GI and the interlayer insulation layer IL.

A passivation layer PL may be disposed on the first source electrode SE1 and the first drain electrode DE1. The passivation layer PL may play a role of a protection film configured to protect the driving thin film transistor TFT1, or of a planarization layer configured to planarize the upper surface thereof.

The organic electroluminescent member 120 may be disposed on the passivation layer PL. The organic electroluminescent member 120 may include the first electrode EL1, a second electrode EL2 disposed on the first electrode EL1, an organic layer OL disposed between the first electrode EL1 and the second electrode EL2, and a light-emitting layer EML.

Specifically, the first electrode EL1 may be disposed on the passivation layer PL, and a pixel defining layer PDL may be disposed on the passivation layer PL and the first electrode EL1. The pixel defining layer PL may expose a portion of an upper surface of the first electrode EL1, but is not limited thereto. The pixel defining layer PDL may include a metal-fluorine ion compound.

The organic layer OL and the second electrode EL2 may be laminated sequentially on the pixel defining layer PDL and the first electrode EL1.

The first electrode EL1, for example, may be a positive electrode. The first electrode EL1 may be connected to the first drain electrode DE1 of the driving thin film transistor TFT1 through a third contact hole CH3 defined in the passivation layer PL.

The first electrode EL1 may be conductive. The first electrode EL1 may be a pixel electrode or a positive electrode. The first electrode EL1 may be a transmissive electrode, a semi-transparent electrode, or a reflective electrode. In the case where the first electrode EL1 is a transmissive layer, the first electrode EL1 may include a transparent metal oxide such as, but not limited to, indium tin oxide (ITO), indium zinc oxide (IZO), zinc oxide (ZnO), or indium tin zinc oxide (ITZO). In the case where the first electrode EL1 is a semi-transparent electrode or a reflective electrode, the first electrode EL1 may include Ag, Mg, Al, Pt, Pd, Au, Ni, Nd, Ir, Cr, or a mixture of these metals, but it is not limited thereto.

The second electrode EL2 may be a common electrode or a negative electrode. The second electrode EL2 may be a transmissive electrode, a semi-transparent electrode, or a reflective electrode. In the case where the second electrode EL2 is a transmissive electrode, the second electrode EL2 may include Li, Ca, LiF/Ca, LiF/Al, Al, Mg, BaF, Ba, Ag, or their alloys or combinations thereof (for example, a combination of Ag and Mg), but it is not limited thereto. For example, the second electrode EL2 may include indium tin oxide (ITO), indium zinc oxide (IZO), zinc oxide (ZnO), or indium tin zinc oxide (ITZO).

The first electrode EL1 may be a reflective electrode, and the second electrode EL2 may be a semi-transparent electrode or a transmissive electrode. The flexible display device 10 according to an exemplary embodiment of the present disclosure may include a front emission type organic electroluminescent member 120, but it is not limited thereto. The organic electroluminescent member 120 may be a bottom emission type.

An organic layer OL may be disposed between the first electrode EL1 and the second electrode EL1, but it is not limited thereto. The organic layer OL may include a hole transport region HTR, a light emitting layer EML, and an electron transport region ETR.

The hole transport region HTR may be disposed on the first electrode EL1. The hole transport region HTR may have a single-layer structure comprising a plurality of different materials, or have a laminated structure comprising, in sequence on the first electrode EL1, a hole injection layer/a hole transport layer, a hole injection layer/a hole transport layer/a hole buffering layer, a hole injection layer/a hole buffering layer, a hole transport layer/a hole buffering layer, or a hole injection layer/a hole transport layer/an electron blocking layer, but it is not limited thereto.

The light emitting layer EML may be disposed on the hole transport layer HTR. The light emitting layer EML may have a single-layer structure comprising a single material, a single-layer structure comprising a plurality of different materials, or a multi-layer structure having a multiple layers comprising a plurality of different materials.

When the light emitting layer EML is a single layer, the light emitting layer EML, for example, may emit red light, green light, or blue light, but it is not limited thereto.

The light emitting layer EML may, but not particularly limited, include a typically used material, for example, a material emitting red, green, or blue, and include a fluorescent material, or a phosphorescent material. Also, the light emitting layer EML may include a host, or a dopant.

An electron transport region ETR may be disposed on the light emitting layer EML. The electron transport region ETR may include at least one of a hole blocking layer, an electron transport layer, or an electron injection layer, but it is not limited thereto.

The hole transport region HTR, the light emitting layer EML, and the electron transport region may adopt materials known in the art.

Figure 12:
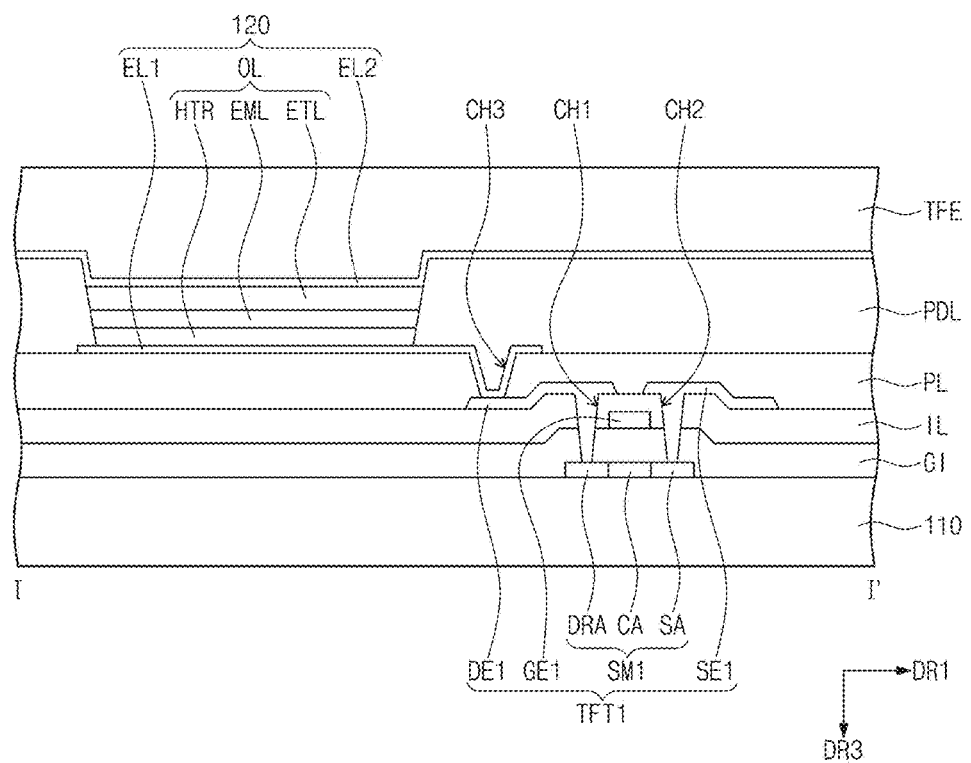
FIG. 12 is a cross-sectional view of a portion of the circuit diagram of FIG. 10.

Referring to FIG. 1 and FIG. 12, a flexible display panel 100 may further include additional components when needed.

For example, the flexible display panel 100 may further include a thin film encapsulating layer TFE disposed on the organic electroluminescent member 120.

The thin film encapsulating layer TFE may be disposed on the second electrode EL2 of the organic electroluminescent member 120 and encapsulates the organic electroluminescent member 120 together with the substrate 110. The thin film encapsulating layer TFE may protect the organic electroluminescent member 120 which may be vulnerable to moisture and water.

The flexible display device 10 according to an exemplary embodiment of the present disclosure may further include additional components when needed.

Figure 13:
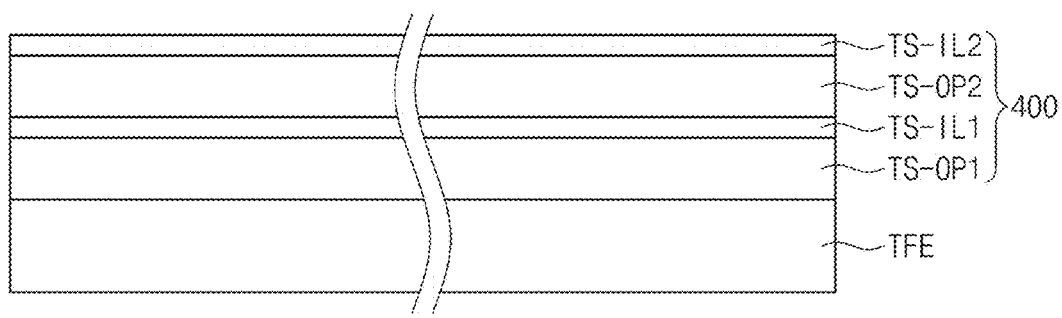
FIG. 13 is a cross-sectional view of a touch sensing member included in a flexible display device according to an exemplary embodiment of the present disclosure.

FIG. 13 is a cross-sectional view of a touch sensing member included in a flexible display device according to an exemplary embodiment of the present disclosure. Referring to FIG. 13, the flexible display device 10 according to an exemplary embodiment of the present disclosure may further include a touch sensing member 400.

The touch sensing member 400 may be disposed on the thin film encapsulating layer TFE. The touch sensing member 400 may be directly disposed on the thin film encapsulating layer TFE, but it is not limited thereto. Between the thin film encapsulating layer TFE and the touch sensing member 400, an inorganic layer such as a buffering layer and the like and/or a substrate to provide the touch sensing member 400 may be disposed.

The touch sensing member 400 may adopt materials generally known in the art. The touch sensing member 400, for example, may include a first conductive layer TS-OP1 disposed on the thin film encapsulating layer TFE, a first touch insulating layer TS-IL1 disposed on the first conductive layer TS-OP1, a second conductive layer TS-OP2 disposed on the first touch insulating layer TS-LI1, and a second touch insulating layer TS-IL2 disposed on the second conductive layer TS-OP2. The first conductive layer TS-OP1 may be directly disposed on the thin film encapsulating layer TFE, but not limited thereto.

Figure 14:
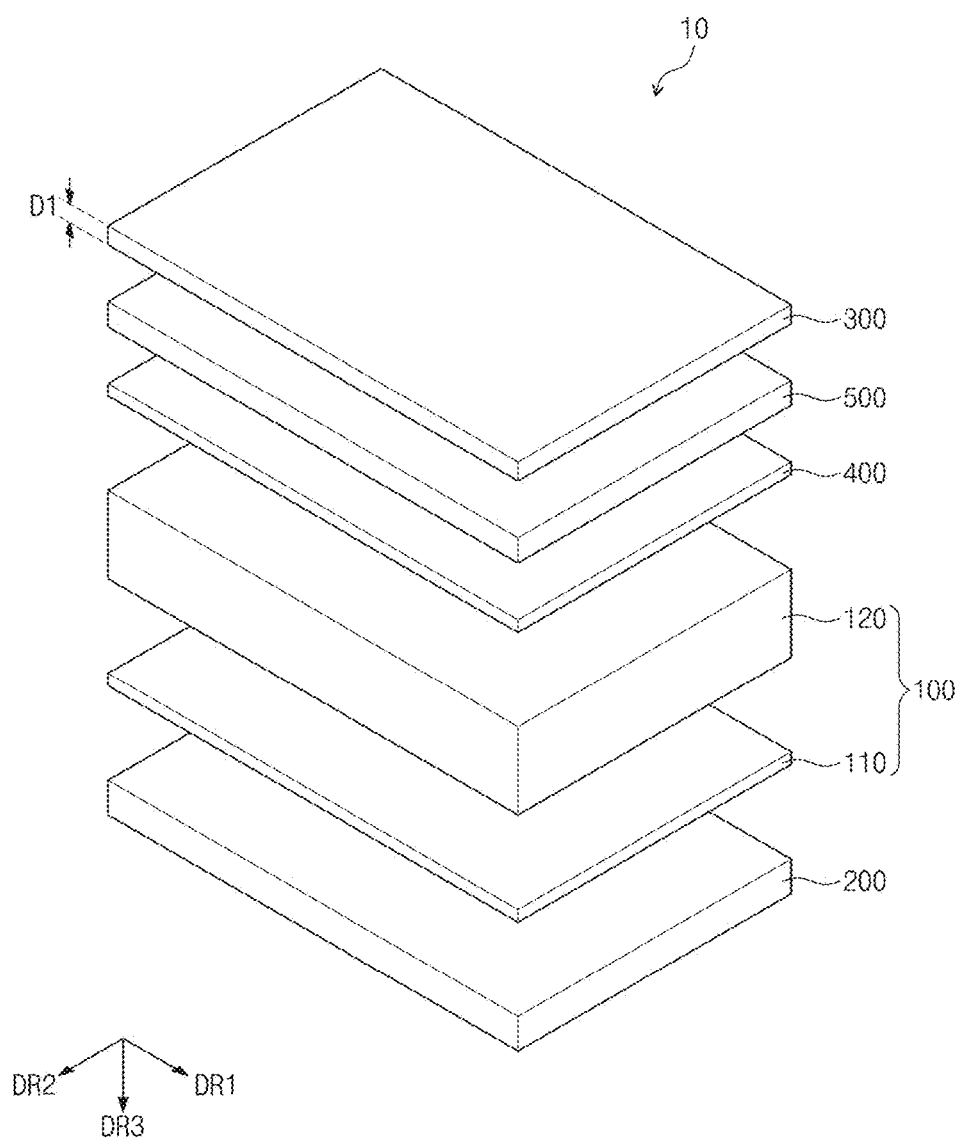
FIG. 14 is an exploded perspective view of a flexible display device according to an exemplary embodiment of the present disclosure.

FIG. 14 is an exploded perspective view of a flexible display device according to an exemplary embodiment of the present disclosure.

Referring to FIG. 14, the touch sensing member 400 is disposed between the flexible display panel 100 and the window member 300. The flexible display device 10, according to an exemplary embodiment of the present disclosure, may further include a polarizing member 500 disposed between the flexible display panel 100 and the window member 300. The polarizing member 500 may be disposed on the touch sensing member 400. The polarizing member 500 may adopt materials generally known in the art.

Although not shown in detail, the flexible display device 10 according to an exemplary embodiment of the present disclosure may further include a third adhesive member disposed between the touch sending member 400 and the polarizing member 500, and a fourth adhesive member disposed between the polarizing member 500 and the window member 300, but not limited thereto. The third adhesive member and the fourth adhesive member may also be omitted. The third adhesive member and the fourth adhesive member may also be a pressure-sensitive adhesive PSA.

Figure 15:
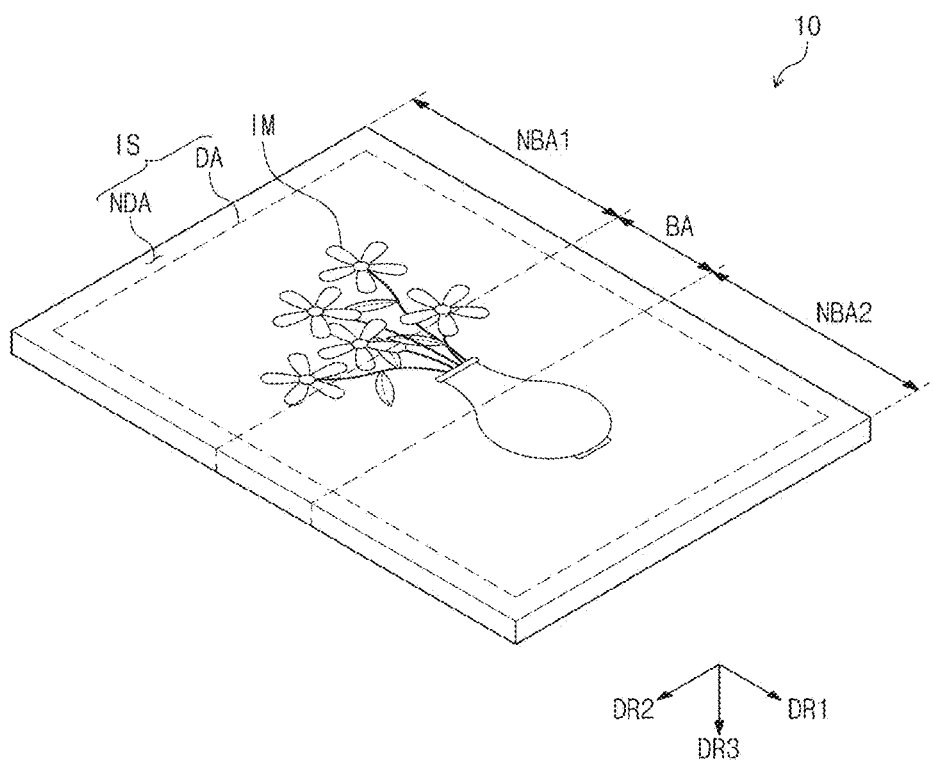
FIG. 15 is a perspective view of a flexible display device in a spreading state according to an exemplary embodiment of the present disclosure.
Figure 16:
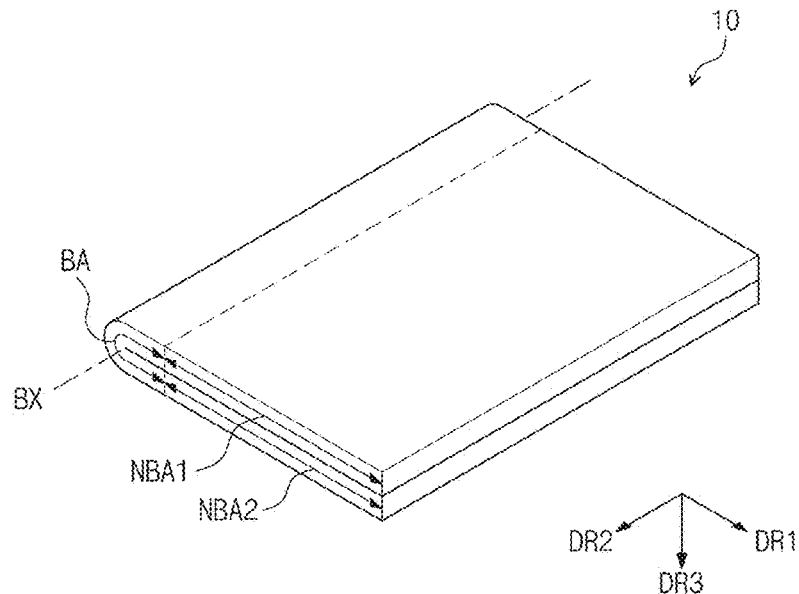
FIG. 16 is a perspective view of a flexible display device in a bent state according to an exemplary embodiment of the present disclosure.
Figure 17:
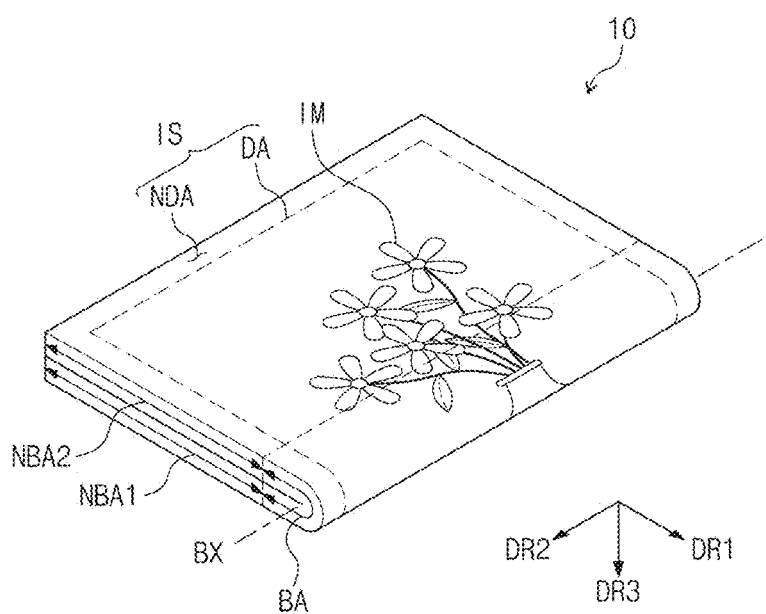
FIG. 17 is a perspective view of a flexible display device in a bent state according to an exemplary embodiment of the present disclosure.
Figure 18:
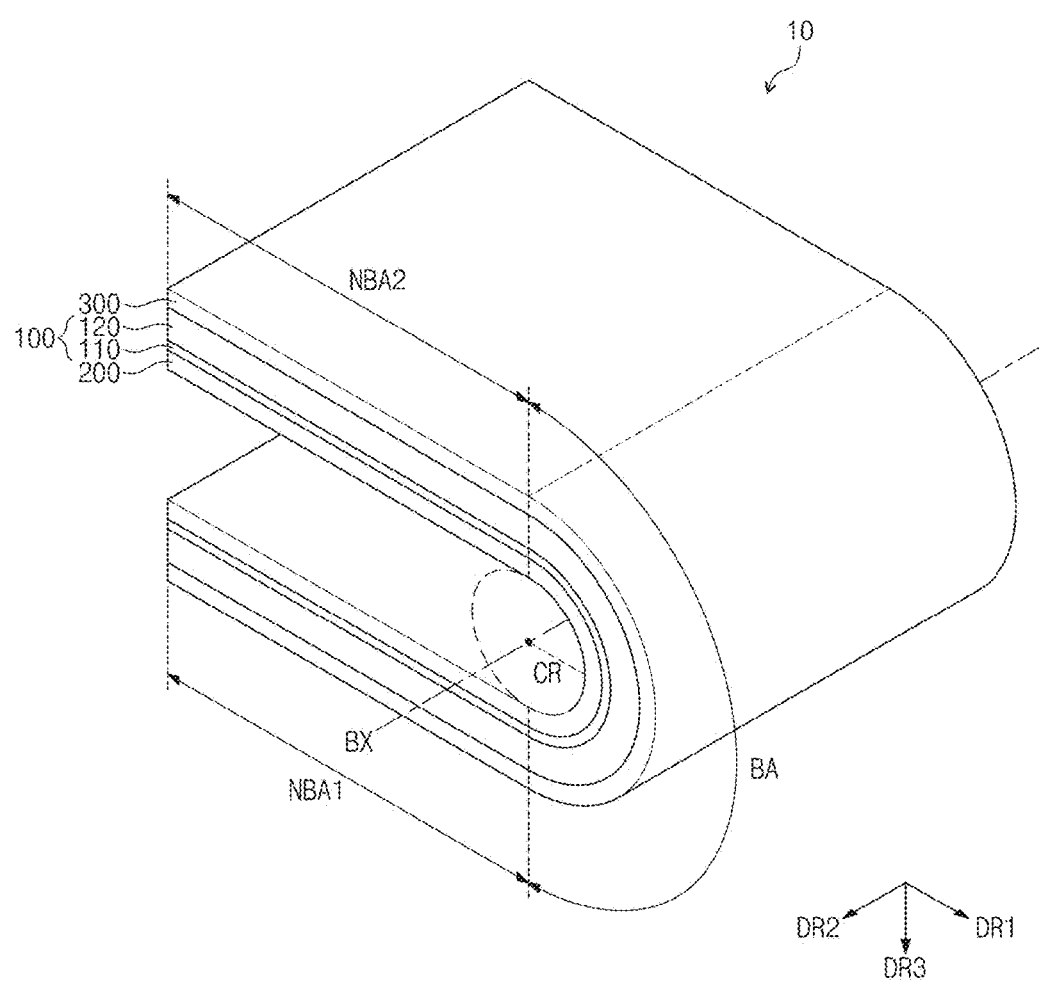
FIG. 18 is a perspective view of a flexible display device in a bent state according to an exemplary embodiment of the present disclosure.

FIG. 15 is a perspective view of a flexible display device in a spreading state according to an exemplary embodiment of the present disclosure. FIG. 16 is a perspective view of a flexible display device in a bent state according to an exemplary embodiment of the present disclosure. FIG. 17 is a perspective view of a flexible display device in a bent state according to an exemplary embodiment of the present disclosure. FIG. 18 is a perspective view of a flexible display device in a bent state according to an exemplary embodiment of the present disclosure.

Referring to FIG. 15 to FIG. 18, the flexible display device 10 according to an exemplary embodiment of the present disclosure may be a foldable display device, but it is not limited thereto. For example, the flexible display device 10 according to an exemplary embodiment of the present disclosure may be a rollable display device, or a bent display device. The flexible display device 10 according to an exemplary embodiment of the present disclosure may be used for large electronic devices including a TV, a monitor, and the like, and for small and medium electronic devices, including a cell phone, a tablet, a car navigation system, a game console, a smartwatch, and the like.

The flexible display device 10 according to an exemplary embodiment of the present disclosure may operate in a first mode, or a second mode.

Specifically, FIG. 15 shows the flexible display device 10 according to an exemplary embodiment of the present disclosure operating in the second mode, and FIG. 16 to FIG. 18 shows the flexible display device 10 according to an exemplary embodiment of the present disclosure operating in the first mode.

Referring to FIG. 16 to FIG. 18, at least a portion of each of the flexible display panel 100, the window member 300, and the protection member 200 may be bent about the bending axis BX in the first mode.

Referring to FIG. 15, a display surface IS in which an image IM is displayed may be parallel to a surface defined by the first direction DR1 and the second direction DR2 when operating in a second mode. The display surface IS of the flexible display device 10 may include the display area DA and the non-display area NDA described above. In FIG. 15, a flower vase is illustrated as an example of the image IM.

As shown in FIG. 15 to FIG. 17, the flexible display device 10 according to an exemplary embodiment of the present disclosure may include a plurality of regions defined according to a type of an operation. The flexible display device 10 according to an exemplary embodiment of the present disclosure may include a bent area BA which may be bent on the basis of the bending axis BX, and a first non-bent area NBA1 and a second non-bent area NBA2 which are not bent.

The first mode may include a first bending mode and a second bending mode. The flexible display device 10 according to an exemplary embodiment of the present disclosure may be bent toward one direction about the bending axis in the first bending mode. Referring to FIG. 16, the flexible display device 10 may be the one bending in the first mode such that the window member 300 faces toward the inside. In the first bending mode, an inner bending of the flexible display device 10 may occur such that the display surface IS of the first non-bent area NBA1 and the display surface IS of the second non-bent area NBA2 face each other. Referring to FIG. 17, the flexible display device 10 may be the one bending in the second bending mode such that the protection member 200 faces the inside. In the second bending mode, the flexible display device 10 according to an exemplary embodiment of the present disclosure may be outer-bending such that the display surface IS may be exposed to the outside.

The flexible display device 10 according to an exemplary embodiment of the present disclosure may have a radius of curvature of from 0.5 mm to 20 mm, or from 1 mm to 10 mm in the first mode.

Referring to FIG. 18, the flexible display device 10 according to an exemplary embodiment of the present disclosure may operate in the second bending mode in the first mode, and the protection member 200 may be closer to the bending axis BX than the window member 300 is.

In FIG. 15 to FIG. 18, only one bent area BA is illustrated, but it is not limited thereto. For example, the flexible display device 10 according to an exemplary embodiment of the present disclosure may include a plurality of bent areas BA. The flexible display device 10 according to an exemplary embodiment of the present disclosure may be configured to be operated repeatedly in the first mode or in the second mode, but it is not limited thereto. The bent area BA may be defined corresponding to how a user operates the display device 10. For example, the bent area BA may be defined to be parallel to the first direction DR1 different from FIG. 15 to FIG. 18, or defined in a diagonal direction. The area of the bent area BA is not fixed, and may be determined according to a radius of curvature.

Figure 19:
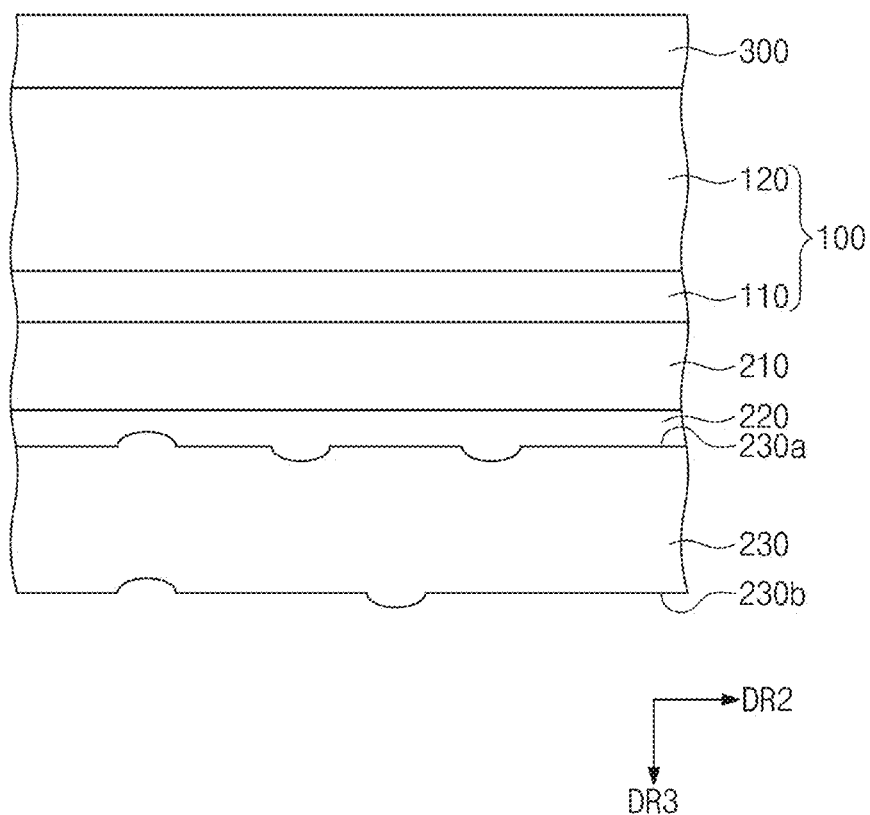
FIG. 19 is a schematic cross-sectional view of a flexible display device according to another exemplary embodiment of the present disclosure.

FIG. 19 is a schematic cross-sectional view of a flexible display device according to another exemplary embodiment of the present disclosure.

Hereinafter, referring to FIG. 19, the flexible display device 10 according to another exemplary embodiment of the present disclosure will be described.

In the following, the differences from the flexible display device 10 according to an exemplary embodiment of the present disclosure described above will be focused, and the parts not described below may be applied as described above.

In FIG. 19, for convenience, the same reference numerals described above are used for the same/similar components of the flexible display device according to an exemplary embodiment of the present disclosure.

The flexible display device according to another exemplary embodiment of the present disclosure may include a flexible display panel 100 including a substrate 110, an organic electroluminescent member 120 disposed on the substrate 110, a window member 300 disposed on the flexible display panel 100, a protection member 200 disposed under the flexible display panel 100, wherein the protection member 200 comprises a metal layer 210 disposed under the substrate 110 and having a nickel-iron alloy, an organic layer 220 disposed under the metal layer 210, and a cushion layer 230 disposed under the organic layer 220 where at least one of the upper or the lower surface of which includes an uneven portion.

The organic layer 220 and the cushion layer 230 may be in contact with each other. The organic layer 220 may cover an uneven portion of the cushion layer 230 such that the uneven portion of the cushion layer 230 may not influence the flexible display panel 100 and the window member 300.

The organic layer 220 may include at least one of poly urethane, poly acrylic, polyimide, and poly epoxy. For example, the organic layer 220 may be a poly urethane layer. The organic layer 220 may also be a polymer resin foam.

Referring back to FIG. 6, the organic layer 220 may include the first sub-layer 221 and the second sub-layer 222. The first sub-layer 221 may be disposed under the metal layer 210, and the second sub-layer 222 may be disposed under the first sub-layer 221. The density of the second sub-layer 222 may be lower than the density of the first sub-layer 221. The modulus of the second sub-layer 222 may be smaller than the modulus of the first sub-layer 221. The detailed description of the first sub-layer 221 and the second sub-layer 222 may be the same as described above, and therefore, is omitted.

The flexible display device 10 according to an exemplary embodiment of the present disclosure may include a planarization layer disposed on the cushion layer 230, and therefore, reduce a deterioration in surface quality caused by an uneven portion of the cushion layer 230. That is, improved surface quality may be realized by the flexible display device 10 according to an exemplary embodiment of the present disclosure.

As described above, a flexible display device according to an exemplary embodiment of the present disclosure may provide an improved surface quality.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A flexible display device, comprising:
   a flexible display panel comprising a substrate and an organic electroluminescent member disposed on the substrate;
   a window member disposed on the flexible display panel; and
   a protection member disposed under the flexible display panel,
   wherein the protection member comprises:
      a metal layer disposed under the substrate;
      a cushion layer disposed under the metal layer; and
      a planarization layer and disposed between the metal layer and the cushion layer.

2. The flexible display device of claim 1, wherein at least one of the upper surface and the lower surface of the cushion layer comprises an uneven portion.

3. The flexible display device of claim 2, wherein the cushion layer comprises a plurality of air gaps defined thereinside.

4. The flexible display device of claim 1, wherein:
   the planarization layer comprises a first sub-layer disposed under the metal layer,
   a second sub-layer disposed under the first sub-layer, and
   a density of the second sub-layer is lower than a density of the first sub-layer.

5. The flexible display device of claim 4, wherein the first sub-layer and the second sub-layer are in contact with each other.

6. The flexible display device of claim 4, wherein the first sub-layer and the second sub-layer comprise a same material.

7. The flexible display device of claim 1, wherein:
   the planarization layer comprises a first sub-layer disposed under the metal layer,
   a second sub-layer disposed under the first sub-layer, and
   a modulus of the second sub-layer is smaller than a modulus of the first sub-layer.

8. The flexible display device of claim 1, wherein the planarization layer comprises at least one of poly urethane, poly acrylic, polyimide, and poly epoxy.

9. The flexible display device of claim 1, wherein the metal layer comprises a nickel-iron alloy.

10. The flexible display device of claim 1, wherein the window member comprises a glass substrate, and the thickness of the window member is about 50 µm to about 90 µm, inclusively.

11. The flexible display device of claim 1, wherein the metal layer and the planarization layer are in contact with each other.

12. The flexible display device of claim 1 further comprising:
   a first adhesive member disposed between the substrate and the metal layer; and
   a second adhesive member disposed between the planarization layer and the cushion layer.

13. The flexible display device of claim 12, wherein a modulus of the planarization layer is larger than a modulus of each of the first adhesive member and the second adhesive member.

14. The flexible display device of claim 1, wherein the organic electroluminescent member comprises:
   a first electrode disposed on the substrate;
   an organic layer disposed on the first electrode and having a light-emitting layer; and
   a second electrode disposed on the organic layer,
   wherein the flexible display panel comprises a thin film encapsulating layer disposed on the second electrode and configured to seal the organic electroluminescent member together with the substrate.

15. The flexible display device of claim 14 further comprising:
   a touch sensing member disposed on the thin film encapsulating layer, wherein the thin film encapsulating layer and the touch sensing member are in contact with each other.

16. The flexible display device of claim 1 further comprising:
   a polarizing member disposed between the flexible display panel and the window member.

17. The flexible display device of claim 1 operating:
   in a first mode in which at least a portion of each of the flexible display panel, the window member, and the protection member is bent about a bending axis; or
   in a second mode in which each of the flexible display panel, the window member, and the protection member are not bent about a bending axis.

18. The flexible display device of claim 17, wherein the protection member is closer to the bending axis than the window member is in the first mode.

19. A flexible display device, comprising:
   a flexible display panel comprising a substrate and an organic electroluminescent member disposed on the substrate;
   a window member disposed on the flexible display panel; and
   a protection member disposed under the flexible display panel,
   wherein the protection member comprises:
      a metal layer disposed under the substrate and having a nickel-iron alloy;
      an organic layer disposed under the metal layer; and
      a cushion layer disposed under the organic layer and at least one of the upper and the lower surface of which comprises an uneven portion.

20. The flexible display device of claim 19, wherein:
   the organic layer comprises:
      a first sub-layer disposed under the metal layer; and
      a second sub-layer disposed under the first sub-layer, and
   a density of the second sub-layer is lower that a density of the first sub-layer.

* * * * *